(12) United States Patent
Robinson et al.

(10) Patent No.: US 7,026,868 B2
(45) Date of Patent: Apr. 11, 2006

(54) VARIABLE SUPPLY AMPLIFIER SYSTEM

(75) Inventors: Ian Robinson, Venice, CA (US); Frank Winter, San Diego, CA (US)

(73) Assignee: Northrop Grumman Corporation, Los Angeles, CA (US)

( * ) Notice: Subject to any disclaimer, the term of this patent is extended or adjusted under 35 U.S.C. 154(b) by 18 days.

(21) Appl. No.: 10/717,695

(22) Filed: Nov. 20, 2003

(65) Prior Publication Data

US 2005/0110562 A1 May 26, 2005

(51) Int. Cl.
*H03F 3/38* (2006.01)
*H03G 3/20* (2006.01)

(52) U.S. Cl. .................... 330/10; 330/136; 330/297

(58) Field of Classification Search .............. 330/10, 330/136, 297
See application file for complete search history.

(56) References Cited

U.S. PATENT DOCUMENTS

| | | | | |
|---|---|---|---|---|
| 5,442,317 | A | * | 8/1995 | Stengel ..................... 330/10 |
| 5,831,475 | A | * | 11/1998 | Myers et al. ............... 330/10 |
| 5,898,342 | A | * | 4/1999 | Bell .......................... 330/297 |
| 6,107,880 | A | * | 8/2000 | Shaw ........................ 330/136 |
| 6,141,541 | A | | 10/2000 | Midya et al. |
| 6,157,253 | A | | 12/2000 | Sigmon et al. |
| 6,256,482 | B1 | | 7/2001 | Raab |
| 6,407,634 | B1 | | 6/2002 | Staudinger et al. |
| 6,438,360 | B1 | | 8/2002 | Alberth, Jr. et al. |
| 6,617,920 | B1 | | 9/2003 | Staudinger et al. |
| 2003/0198300 | A1 | | 10/2003 | Matero et al. |

FOREIGN PATENT DOCUMENTS

WO   WO 02/103895 A   12/2002

OTHER PUBLICATIONS

Gary Hanington, et al., "High-Efficiency Power Amplifier Using Dynamic Power-Supply Voltage for CDMA Applications", IEEE Transactions on Microwave Theory and Techniques. vol. 47. No. 8. Aug. 1999.

Ranjan M et al: "*Microwave Power Amplifiers with Digitally-Controlled Power Supply Voltage for High Efficiency and High Linearity*", Microwave Symposium Digest, 2000 IEEE MTT-S International Boston, MA USA Jun. 11-16, 2000, Piscataway, NJ USA, IEEE, US, vol. 1, pp. 493-496, XP010506024, ISBN: 0-7803-5687-X; Relevance—whole document.

\* cited by examiner

*Primary Examiner*—Khanh V. Nguyen
(74) *Attorney, Agent, or Firm*—Tarolli, Sundheim, Covell & Tummino L.L.P.

(57) ABSTRACT

Systems and methods are provided for determining and providing an appropriate variable voltage supply to a power amplifier. A power amplifier is operative to amplify an input signal. A digital buffer stores a copy of the input signal representing a predetermined interval of time. An envelope profiler analyzes the buffered interval of the input signal and determines an appropriate supply signal profile for the power amplifier over the predetermined time interval. A supply control provides a supply signal according to the determined profile.

24 Claims, 6 Drawing Sheets

VARIABLE SUPPLY AMPLIFIER SYSTEM

TECHNICAL FIELD

The present invention relates generally to electronic devices, and more particularly to a variable supply amplifier system.

BACKGROUND OF THE INVENTION

Modern transmitters for applications such as cellular, personal, and satellite communications employ digital modulation techniques such as quadrature phase-shift keying (QPSK) in combination with code division multiple access (CDMA) communication. Shaping of the data pulses mitigates out-of-band emissions from occurring into adjacent channels but produces time-varying envelopes. In addition to amplifying individual waveforms with time varying envelopes, many transmitters (especially in base stations) are being configured to amplify multiple carriers. Multi-carrier signals have a wide distribution of power levels resulting in a large peak-to-average ratio (PAR). The operation of amplifiers (e.g., linear amplifiers) in these types of signals is very inefficient, since the amplifiers are sized so that their supply voltage is high enough to handle the large peak voltages even though the signals are much smaller a substantial portion of the time. Additionally, the size and cost of the power amplifier is generally proportional to the required peak output power of the amplifier.

Wideband Code Division Multiple Access (WCDMA), Orthogonal Frequency Division Multiplexing (OFDM), and multi-carrier versions of Global Standard for Mobile Communication (GSM) and Code Division Multiple Access 2000 (CDMA 2000) are wireless standards and applications growing in use. Each requires amplification of a waveform with high PAR levels, above 10 dB in some cases. The sparse amount of spectrum allocated to terrestrial wireless communication requires that transmissions minimize out-of-band (OOB) emissions to minimize the interference environment. A linear amplifier used to amplify a waveform with a PAR of 10 dB or more provides only 5–10% DC-RF efficiency. The peak output power for the amplifier is sized by the peak waveform. The cost of the amplifier scales with its peak power. Several other circuit costs including heat sinks and DC-DC power supplies scale inversely to peak power and dissipated heat (which results from the electrical inefficiency). Related base station costs of AC-DC power supplies, back-up batteries, cooling, and circuit breakers also scale inversely with efficiency as does the electrical operating costs. Clearly, improving DC-RF efficiency is a major cost saver for both manufacture and operation.

One efficiency enhancement technique for power amplifiers is known as envelope tracking or envelope following. In an envelope tracking system, the supply voltage to a power amplifier is reduced or increased in response to the amplitude of the amplitude modulated envelope of the input signal. The supply voltage applied to the power amplifier follows the envelope of the input signal provided to the power amplifier. The supply voltage is maintained at levels that assure amplifier operation out of saturation. For example, when the envelope amplitude is at peak, the supply voltage is increased to a voltage greater than the desired amplifier output voltage at the signal peak. When the envelope amplitude is at its minimum, the supply voltage is decreased below the peak voltages, thus providing more efficient amplification than a constant supply linear amplifier.

Accurately tracking ensures that the supply voltage of the amplifier provides roughly a constant number of volts or "headroom" above the output power. Increasing this constant amount reduces efficiency but improves linearity. Conversely, reducing the difference between the supply voltage and the output voltage improves efficiency at the cost of increased distortion and out-of-band (OOB) emissions. Tracking an input signal envelope can require abrupt or high frequency changes in the supply voltage of the amplifier. Providing such drastic changes can require voltage supply components having a large bandwidth to properly supply the amplifier and avoid distortion of the amplifier output. Components having the desired bandwidth often have other undesired attributes, such as a lower efficiency than their low bandwidth counter parts. The efficiency loss from these components can partially or fully negate the efficiency gained by provided a variable amplifier supply.

SUMMARY OF THE INVENTION

In accordance with one aspect of the present invention, a variable supply amplifier system is provided. A power amplifier is operative to amplify an input signal. The system delays and stores (e.g., in a digital buffer) a copy of the input signal representing a predetermined interval of time. An envelope profiler analyzes the buffered interval of the input signal and determines an appropriate supply signal profile for the power amplifier over the predetermined time interval. A supply control provides a supply signal according to the determined profile. The supply signal can thus be optimized to enable minimum bandwidth, high efficiency amplification components. Further the system can be programmed to ensure specific amounts of headroom as a function of input signal level, optimizing linearity and main amplifier efficiency.

In accordance with another aspect of the present invention, a method is provided for amplifying an input signal. At least a portion of the input signal is stored in a buffer, the portion corresponding to an interval of time. The buffered signal portion is analyzed to determine an appropriate supply signal for a power amplifier across the interval of time. The input signal is amplified at the power amplifier using the determined supply signal to produce an amplified output signal.

DETAILED DESCRIPTION OF INVENTION

The present invention relates to a variable supply amplifier system that tracks the signal at a decreased slew rate to maintain efficient operation in the variable supply loop. The amplifier system stores a copy of an input signal within a buffer and evaluates the signal to determine a necessary amplifier supply voltage over the buffered signal portion. An amplifier supply profile is then determined that allows for efficient operation of the power amplifier while maintaining a desired slew rate. This allows the use of more efficient, low bandwidth components in the supply path, increasing the overall efficiency of the system.

Figure 1:
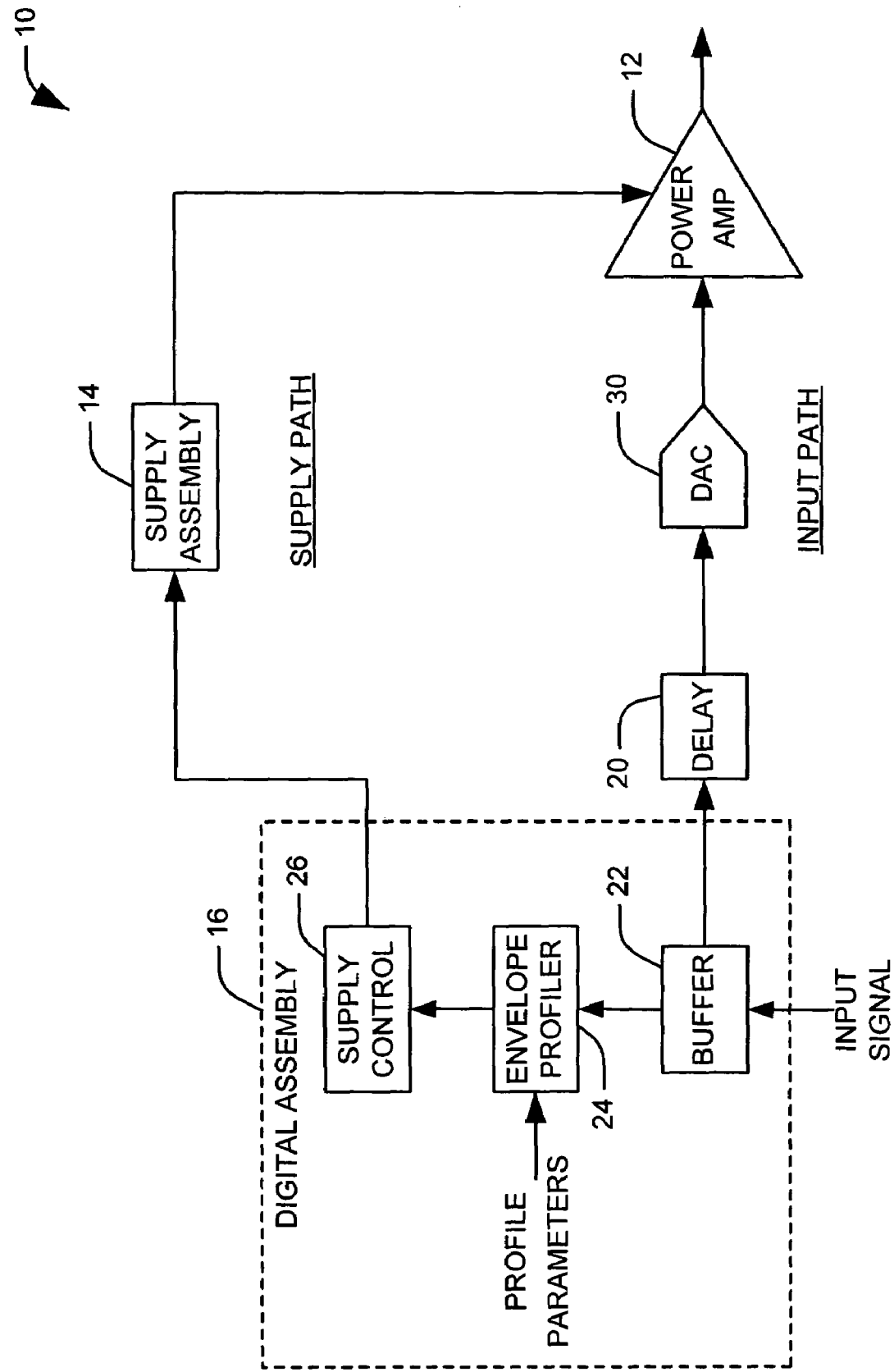
FIG. 1 illustrates a schematic block diagram of an amplifier system in accordance with an aspect of the present invention.

FIG. 1 illustrates an amplification system or architecture 10 in accordance with an aspect of the present invention. The amplification system 10 monitors the amplitude level of a buffered interval of an input signal to determine an appropriate supply voltage profile for an associated power amplifier 12 over the buffered interval. The power amplifier 12 includes an input terminal and a supply terminal. The amplification system 10 can then increase and decrease the supply voltage gradually, (e.g., at a reduced slew rate) to maintain efficient operation of a supply assembly 14 associated with the supply path of the power amplifier 12.

The amplification system 10 includes a digital assembly 16. The digital assembly 16 can comprise one or more application specific integrated circuits (ASIC), field programmable gate arrays (FPGA), digital signal processors (DSP) or a combination of digital hardware and/or software components. The digital assembly 12 is coupled to the supply assembly 14 along a supply path. The supply assembly 14 provides a supply voltage at a voltage level to the supply and/or bias of the power amplifier 12. The supply assembly 14 can comprise appropriate components for providing a supply voltage to the power amplifier 12 such as a DC-to-DC converter or a second amplifier and a digital-to-analog converter.

It will be appreciated that the supply assembly 14 can have an associated bandwidth that limits the rate at which the amount of voltage provided by the supply assembly can be changed. While supply assembly components can be designed to overcome this bandwidth limitation, the increase in bandwidth generally comes at a loss of overall efficiency or other desired characteristic of the supply assembly. It is thus desirable to maintain the rate of change, or slew rate, of the supply voltage below a maximum value such that a supply assembly 14 having a desired, reduced bandwidth can be utilized.

A digital input signal is received at the digital assembly 16 at a buffer 20, which stores the input signal over an interval of time. The signal is then passed to a delay component 20. The buffer 22 is operatively connected to an envelope profiler 24. The envelope profiler 24 analyzes the signal interval stored in the buffer to determine an appropriate supply profile for the buffered interval. As the envelope profiler 24 analyzes the upcoming values of the delayed signal to produce an appropriate profile, the analysis can be referred to as "look ahead" profiling of the signal envelope.

The envelope profiler 24 constructs a supply voltage profile based on the amplitude changes determined from the buffered input signal and one or more associated parameters. In an exemplary embodiment, three parameters can be used. A first parameter can be the maximum slew rate of the voltage, which is a factor of the bandwidth of the supply assembly 14. Given a maximum slew rate, the envelope profiler 24 reviews the buffered signal for areas of rapid change in the signal amplitude (e.g., peaks) and begins raising or lowering the voltage some time prior to the change according to the desired slew rate. A second parameter can be a minimum supply voltage associated with the power amplifier 12. Generally, the power amplifier 12 will produce significant signal distortion when provided with a supply voltage beneath this amount, so the envelope profiler 24 can be instructed to maintain the supply voltage at or above the minimum supply.

A third parameter can be a minimum amount by which the supply voltage must exceed the desired voltage of the amplified input signal, referred to as the "headroom" of the supply. The power amplifier 12 will produce a distorted signal without this minimum headroom, so the supply profile is constrained to remain greater than the desired amplifier output by at least this headroom value. Within these parameters, the envelope profiler 24 can define a supply profile according to any of several basic architectures. For example, the envelope profiler 24 can define a supply voltage that moves between two levels at the desired slew rate. Such a profile would remain at a first voltage for signals close to an average input signal, and ramp up to a second voltage at a desired slew rate when a peak is detected in the buffered signal. Alternatively, the envelope profiler 24 can define a voltage profile having more than two associated voltage levels, or a tracking waveform that attempts to follow the input signal while maintaining at least a minimum headroom and a maximum slew rate. In an exemplary embodiment, the envelope profile attempts to optimize one or more values within the constraints provided by the given parameters. For example, the envelope profiler 24 can optimize a linearity or efficiency measure associated with the power amplifier 12 and the supply assembly 14.

The determined supply profile is provided to a supply control 26 on the digital assembly that translates the determined profile into a supply signal. This supply signal is provided to the supply assembly 14, which processes the supply signal to provide an appropriate supply voltage to the supply terminal of the power amplifier. The delay 20 is coupled to the input terminal of the power amplifier 12 through a digital-to-analog converter (DAC) 30 as to provide the delayed input signal to the power amplifier along an input path. The delay 20 can be tuned to synchronize the arrival of the input signal and the supply signal at the power amplifier 12.

In one aspect of the invention, the DAC 30 is a delta-sigma modulated DACs. Delta-sigma modulation is a technique used to generate a coarse estimate of a signal using a small number of quantization levels and a very high sampling rate. The small number (e.g., two for a one-bit quantizer) of quantization levels introduces quantization noise into the system. The effect of oversampling and the use of an integrator feedback-loop in delta-sigma modulation are effective in shifting the quantization noise to out-of-band frequencies. The noise shifting properties of the delta-sigma modulator enable efficient use of subsequent filtering stages to remove the quantization noise and produce a more precise representation of the input at a desired frequency. In an exemplary embodiment, a delta-sigma DAC can be employed to upmix the received signal directly to radio transmission frequencies, such that further upmixing of the signals via conventional analog mixers is not required. The radio transmission frequencies can be in radio frequency (RF) ranges (e.g., megahertz range) or in microwave frequency ranges (e.g., gigahertz range).

The power amplifier 12 amplifies the input signal using the supply voltage provided by the supply assembly 14. In an exemplary embodiment, the power amplifier 12 can comprise a linear amplifier (e.g., Class-A, Class-AB, Class-B). It is also to be appreciated that the (main) power amplifier 12 can comprise other more efficient types of amplifiers based on desirable bandwidth and acceptable distortion limits.

Figure 2:
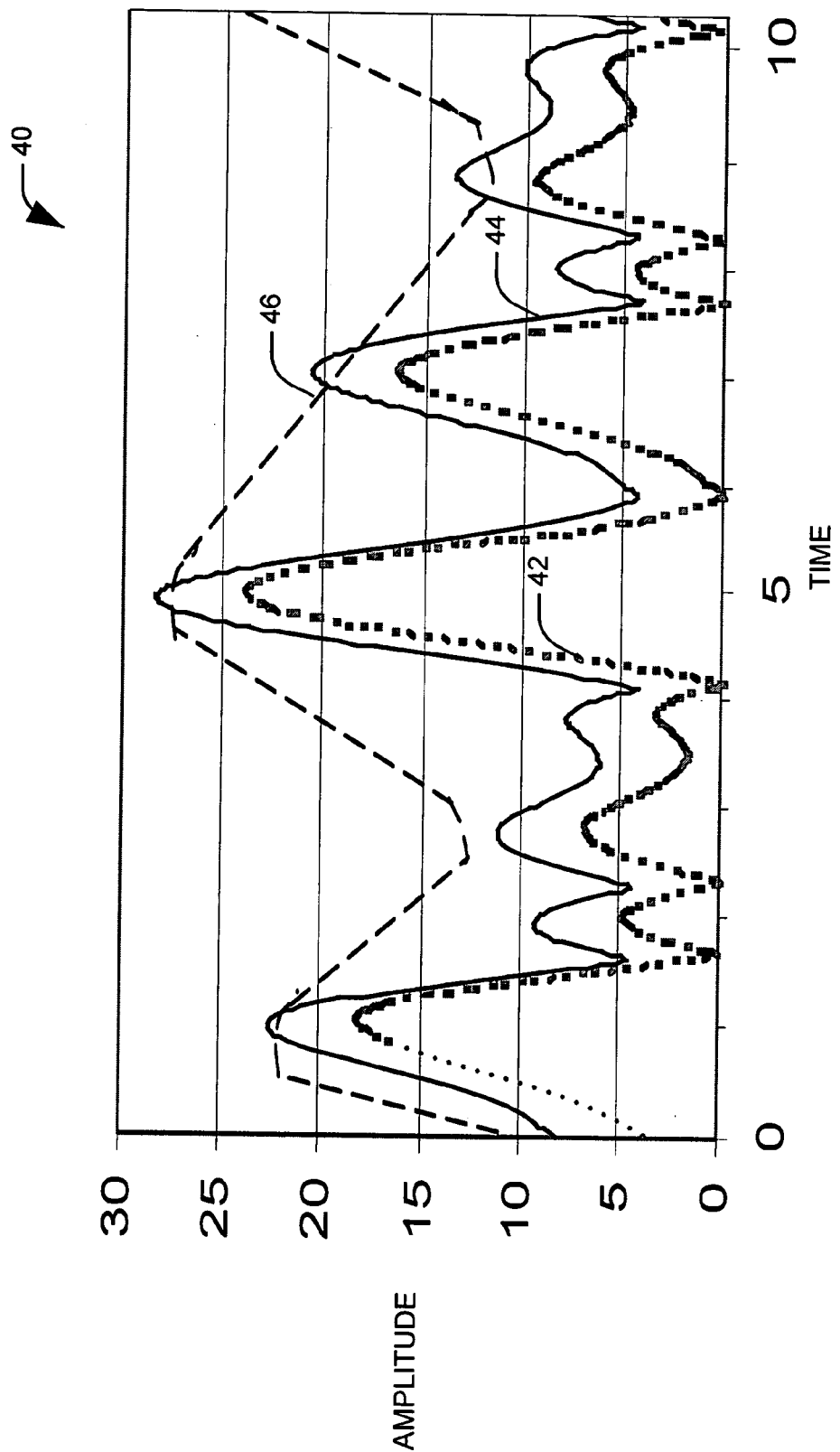
FIG. 2 illustrates a graph of amplitude versus time contrasting a desired amplifier output signal, a supply signal having constant headroom, and a supply signal provided by an exemplary variable supply amplifier in accordance with the present invention.

FIG. 2 illustrates a graph 40 of amplitude versus time of a desired amplifier output signal 42, a supply signal representing a constant headroom envelope tracking system 44, and a supply signal 46 provided by an exemplary variable supply amplifier in accordance with an aspect of the present invention. The desired amplifier output signal 42 is an amplified copy of an input signal (not shown) introduced to an exemplary amplifier system. The envelope tracking signal 44 represents a signal produced by tracking the input signal, determining the desired amplitude, and adding a constant headroom to the desired amplitude. A minimum headroom is necessary to facilitate low distortion amplification of the input signal. The envelope tracking signal 44 is thus similar in shape to the desired output signal 42, but shifted upwards by a predetermined amount. In traditional systems, the envelope of the input signal is detected using analog components, a constant signal (headroom) is added, and the sum is transmitted to an amplification apparatus to provide variable supply to the main amplifier.

In contrast, the variable supply signal 46 generated, in accordance with an aspect of the present invention, loosely follows the shape of the desired output signal 42. The amplification system of the present invention analyzes the input signal for a predetermined time period. This allows the present invention to respond gradually to any peaks in the input signal, maintaining a low associated slew rate in accordance with an aspect of the present invention. For example, the envelope tracking signal 44 immediately rises to follow a peak in the desired output signal 42 at about a time of five units. The steep ascent in the tracking signal 44 requires either reduced efficiency in the voltage supply assembly or other, undesirable compromises in its design. The variable supply signal 46 detects the peak before the input signal is provided to the amplifier (e.g., at about a time of three units) begins raising the supply voltage to match the signal peak, allowing for the use of more efficient supply assembly components having a lower associated bandwidth.

It will be appreciated that, in many applications, the desired output signal will have a significantly larger peak-to-average ratio than the illustrated graph 40. A typical signal can have very few significant signal peaks over a large period of time. The variable supply amplifier of the present amplifier can track an input signal with a large peak-to-average very efficiently, as the supply voltage can be maintained at a steady, relatively low voltage in between relatively infrequent peaks. The efficiency lost by providing extra headroom (to non-peak signals) while ramping up to the infrequent peaks is less than the efficiency gained by using relatively low bandwidth, high efficiency components for the supply assembly.

Figure 3:
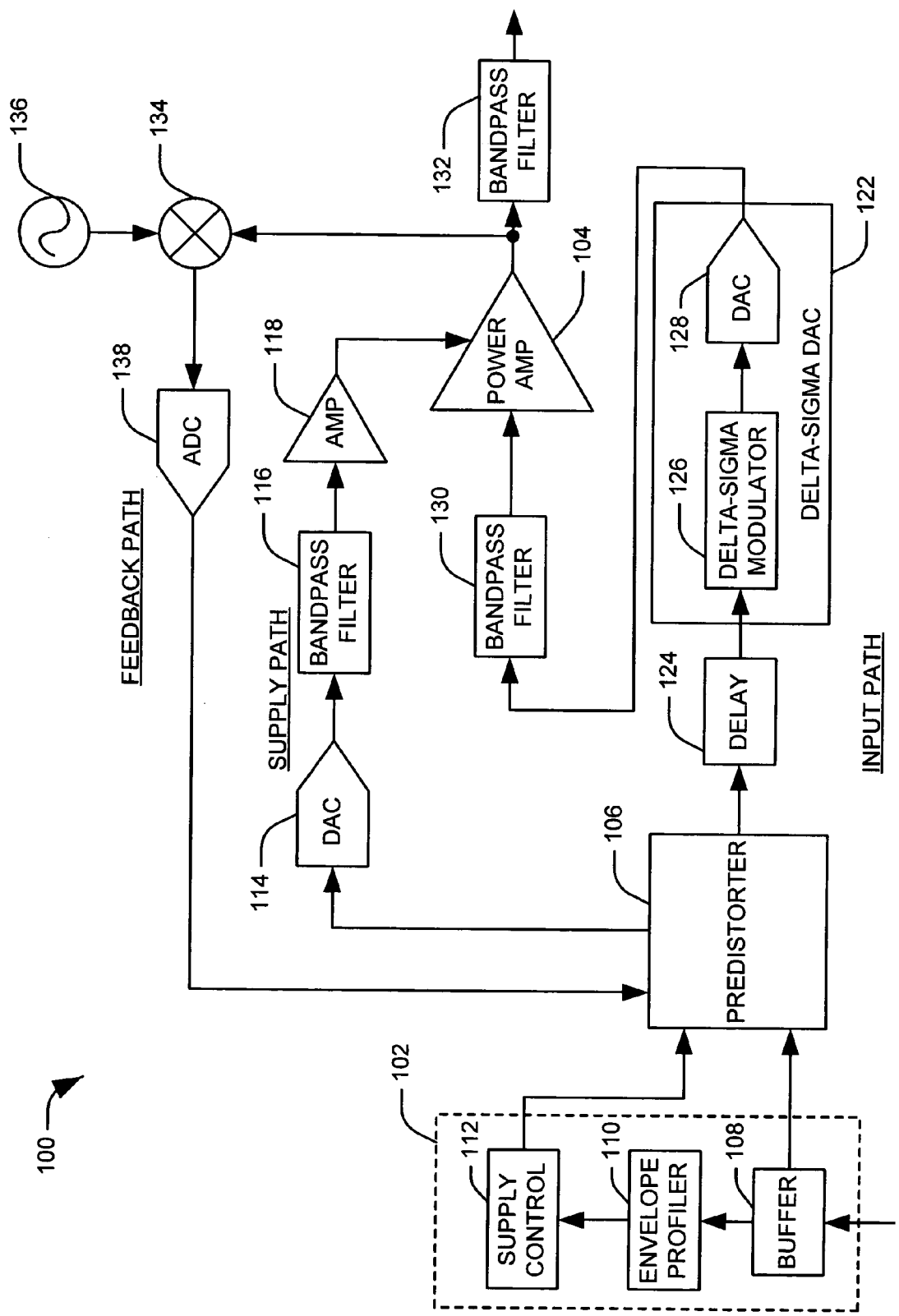
FIG. 3 illustrates a functional block diagram of an amplifier system employing pre-distortion linearization techniques in accordance with an aspect of the present invention.

FIG. 3 illustrates an amplifier system 100 employing pre-distortion linearization techniques in accordance with an aspect of the present invention. Pre-distortion modifies the input signals to reduce anticipated distortion in the amplifier chain as well as in the composite output signal. Determination of the desired pre-distortion is typically performed off-line. Pre-distortion can be performed on either or both of the amplifier input signal and the amplifier supply signal in the digital domain, such that the digital input and supply signals are modified prior to digital-to-analog conversion.

The amplifier system 100 includes a digital assembly 102 that determines an appropriate supply voltage for an associated power amplifier 104 according to anticipated characteristics of an input signal. The digital assembly 102 can comprise digital hardware and software components (not shown) for digitally processing the input signal, such as modulation components and digital filters. In an exemplary embodiment, the digital assembly 102 is a digital signal processor. Once the input signal has been processed by the digital assembly, it is passed to a digital predistorter 106. A copy of the signal representing a predetermined time interval of the signal is retained in a buffer 108.

An envelope profiler 110 analyzes the buffered signal to produce an appropriate supply signal profile for the power amplifier. The envelope profiler 110 is constrained to provide a signal that maintains a minimum headroom distance above the desired output signal, that changes level at or below a maximum slew rate, and that maintains at least a minimum supply voltage. Within these constraints, the envelope profiler 110 can produce a wide variety of supply signal profiles.

In an exemplary embodiment, the envelope profiler 110 produces a two-level signal profile, with an extended ramping period accompanying a change in signal. For example, the two levels can represent an average input signal level and a peak input signal level. When a peak is detected in the buffer, the signal can begin increasing in voltage at or below the desired slew rate, as to reach the peak level before the signal peak reaches the amplifier. Once the peak has passed, the signal can decrease to the average level in a similar manner. Alternatively, the envelope profiler 110 can optimize the signal profile within the given constraints to minimize the headroom of the supply voltage over the desired output signal. This can increase the efficiency of the amplification system 100, but can increase the complexity of the envelope profiler 110.

The supply signal profile is provided to a supply control 112 that provides a supply signal according to the determined supply profile. The supply signal is passed to the digital predistorter 106 along with the input signal. The digital predistorter 106 determines a desired predistortion to add to or remove from one or both of the amplifier input signal and the supply signal. This predistortion 106 can adjust the signal to offset errors introduced by the power amplifier 104 and/or one or more associated filters (e.g., 130 and 132). It is to be appreciated that the digital predistorter 106 can comprise one or more digital hardware components and/or software algorithms. The digital predistorter 106 has a first output coupled to a digital-to-analog converter (DAC) 114 that converts the supply signal to an analog signal along a supply path. A bandpass filter 116 filters noise from the analog supply signal and attenuates frequencies above a maximum frequency associated with a supply amplifier 118. The supply amplifier 118 provides a buffer for the supply signal and adds gain. The output of the supply amplifier 118 is coupled to the supply terminal of the power amplifier 104.

The predistortion component 106 has a second output coupled to a delta-sigma DAC 122 through a delay component 124 along an input path. The delay component 124, is easily implemented with digital logic, which facilitates synchronization of the power amplifier input signal and supply signal. The delta-sigma DAC 122 includes a delta-sigma modulator 126 coupled to a DAC 128. The DAC 128 can be a multi-bit DAC or a single-bit DAC. The output of the delta-sigma DAC 122 is coupled to a band pass filter 130. The delta-sigma modulator 126 performs a digital-to-digital conversion or quantization of the input signal to provide a signal of lower resolution at a higher frequency. The DAC 128 then converts the quantized signal from the digital domain to the analog domain. The band pass filter 130 filters out noise associated with the quantization of the input signal.

The delta-sigma DAC 122 can be employed to convert the signal to radio transmission frequencies, so that the need for analog or digital mixers is not required. The output of the band pass filter 130 is provided to the input terminal of the power amplifier 104 for amplification. The power amplifier 104 can be a linear amplifier (e.g., Class-A, Class-AB, Class-B) based on desired performance, acceptable efficiency, and acceptable OOB emissions. The output of the power amplifier 104 is then filtered by an optional band pass filter 132, such that amplified filtered output signal can be transmitted wireless or wired over a communication link.

The amplifier system 100 includes an optional feedback (FB) path from the output signal to the predistortion component 106 to compensate for variations in the system. The optional feedback path includes an optional mixer 134 and an optional local oscillator 136. The output signal is down-converted and digitized using a high dynamic range, highly linear ADC 138. The digitized values are compared to the expected signal parameters. Differences in measured and expected values are used to adapt the values used by the pre-distortion component 106. In an exemplary embodiment, the adaptation of the values can be performed at a rate substantially slower than the signal and be used primarily to account for temperature and aging changes in the system 100.

It is to be appreciated that optional taps (not shown) can be provided at the gate and drain inputs of the power amplifier 104 to calibrate and synchronize their relative delay. Additionally, an optional feedback path (not shown) from the output of the amplifier 104 can be provided for the supply path. In the optional feedback path, the output of the power amplifier would be passed through an analog envelope detector and sent to a small error amplifier after the DAC 114 in the supply path to remove errors in the supply signal.

Figure 4:
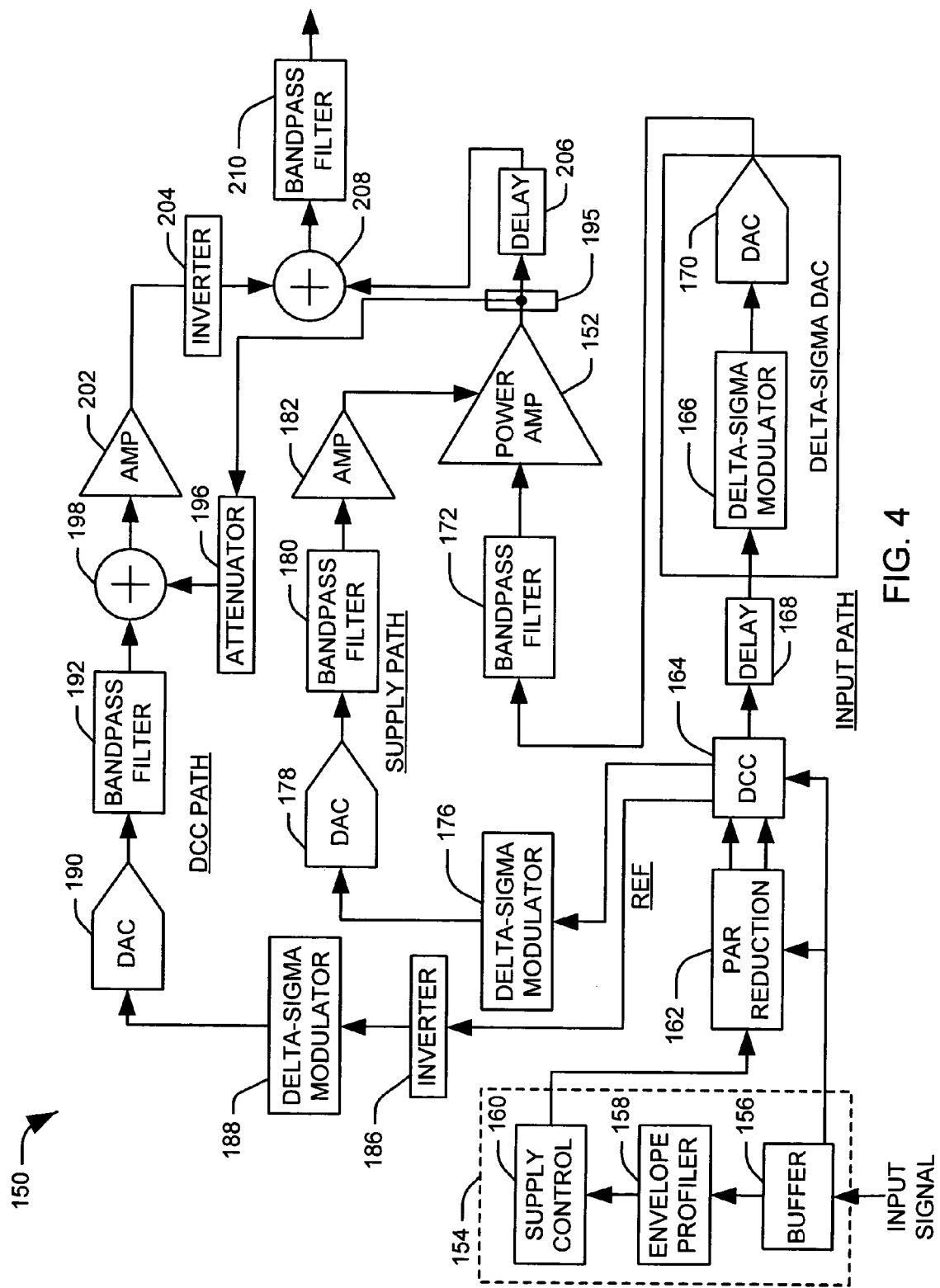
FIG. 4 illustrates an amplifier system employing an alternate linearization technique in accordance with an aspect of the present invention.

FIG. 4 illustrates an amplifier system 150 employing an alternate linearization technique in accordance with an aspect of the present invention. The alternate technique is referred to as digital cross-cancellation (DCC) and can be implemented alone or combined with the predistortion technique illustrated in FIG. 3. The digital cross-cancellation technique provides a digital reference of the wanted signal to a separate DAC generating a "clean" or undistorted version of the wanted signal. The clean version of the wanted signal is phase inverted and combined with a portion of the output signal from a power amplifier 152 to determine the error or unwanted portion of the output signal. The unwanted portion of the input signal is distortion and undesirable OOB emissions. The unwanted portion of the input signal is inverted and combined with the output signal to cancel the unwanted portion from the output signal.

The digital cross-cancellation technique of the present invention provides for post correction and signal cancellation of signals purposefully removed and/or added to the input signal to achieve desired operation of the amplifier system 150. For example, the wanted signal can be clipped or additional signals can be added to reduce overall peak levels, and the digital cross-cancellation technique can remove these added signals prior to transmission of the output signal. Therefore, smaller (lower peak power) and less costly power amplifiers can be employed to achieve similar performance and improved amplifier system efficiency as compared to amplifier systems with much larger less efficient power amplifiers.

A digital assembly 154 receives an input signal, for example, having amplitude and phase modulation. The digital assembly 154 performs any desired various processing tasks (e.g., signal modulation) and distributes the input signal to a peak-to-average (PAR) reduction component 162 and a digital cross-cancellation component 164. A copy of the signal, representing a desired time interval of the signal, is retained in a buffer 156. An envelope profiler 158 analyzes the buffered signal to determine an appropriate supply signal profile for the power amplifier 152. The envelope profiler 158 is constrained to provide a supply signal profile that maintains a minimum headroom distance above the desired output signal, that changes level at or below a maximum slew rate, and that maintains at least a minimum supply voltage. The determined profile is provided to a supply control 160 that provides a supply signal corresponding to the determined profile.

The supply signal is provided to the PAR reduction component 162, along with the input signal. The PAR reduction component 162 can reduce peak signal levels associated with the input signal through clipping of the received input signal or the addition of signals. The PAR reduction component 162 can also pre-distort the supply signal profile or the amplitude and phase of the input signal to counter expected distortion at the power amplifier or one or more associated filters. The PAR reduction component 162 then passes the selected signals to a digital cross-cancellation component 164.

The digital cross-cancellation component 164 generates a first digital output signal along an input path and a second digital output signal along a supply path. The first digital output is the input signal, incorporating any PAR reduction and predistortion provided by the PAR reduction component 162. The second digital output is a supply signal corresponding to the supply voltage profile determined by the envelope profiler 158, taking into account the PAR reduction. The digital cross-cancellation component 164 can add or remove signals to the input signal and the supply signal to improve the performance of the amplifier system 150. The digital cross-cancellation component 164 also receives an additional "clean" copy of the original input signal, which does not contain any PAR reduction or predistortion. This provides a third digital output signal that is a clean reference signal proportional to the desired output prior to any modification of the first digital output signal and the second digital output signal. It is to be appreciated that clean reference signal can be a representation of the desired output signal or an inverted representation of the desired output signal.

The PAR reduced signal is transmitted to a delta-sigma modulator 166 through a delay component 168. The delay component 168 facilitates synchronization of the input signal and the supply signal during amplification and also facilitates the cross-cancellation of the final output signal. The delta-sigma modulator 166 is coupled to a 1-bit DAC 170 and a band pass filter 172. The delta-sigma modulator 166, the 1-bit DAC 170, and the band pass filter 172 cooperate to perform a digital-to-analog conversion directly to radio transmission frequencies. The output of the band pass filter 172 is provided to the input terminal of the power amplifier 152 for amplification. The power amplifier 152 can be a linear amplifier (e.g., Class-A, Class-AB, Class-B) having desired performance, acceptable efficiency and acceptable OOB emissions. The delta-sigma DAC can be replaced by a multi-bit delta sigma DAC or a conventional multi-bit DAC if the DAC linearity can enable sufficiently low distortion for it to generate the error signal.

The supply signal is transmitted to a second delta-sigma modulator 176. The second delta-sigma modulator 176 is coupled to a second 1-bit DAC 178 and a second band pass filter 180. The delta-sigma modulator 176, the 1-bit DAC 178, and the band pass filter 180 cooperate to perform a digital-to-analog conversion directly to radio transmission frequencies. The output of the band pass filter is then provided to a supply amplifier 182 (e.g., Class-S, Class-G). The output of the supply amplifier 182 is coupled to the supply terminal of the power amplifier 152 to provide a supply voltage corresponding to the supply signal profile determined by the envelope profiler 158.

The digital cross-cancellation component 164 provides the clean reference signal (REF) along a DCC path to a digital inverter 186. The clean reference signal corresponds to the desired amplified output signal prior to any modifications. Alternatively, the digital inverter 186 can be eliminated and the inverted version of the clean reference signal can be provided by the digital cross-cancellation component 164. The inverted clean reference signal is transmitted to a third delta-sigma modulator 188. The delta-sigma modulator 188 is coupled to a third 1-bit DAC 190 and a third band pass filter 192. The delta-sigma modulator 188, the 1-bit DAC 190, and the band pass filter 192 cooperate to perform a digital-to-analog conversion directly to radio transmission frequencies of the inverted version of the clean reference signal. If a higher frequency is needed a mixer and local oscillator can be optionally inserted to provide frequency conversion.

A small portion of the power amplifier output is split off by a coupler 195 through an attenuator 196 and summed with the inverted clean reference signal through a summer 198. The output of the summer 198 comprises signal distortion and OOB emissions associated with the output of the power amplifier 152. The output of the summer 198 is amplified by an error amplifier 202 to produce an error signal. The error signal is inverted through an inverter 204 to provide an inverted error signal. The output of the main amplifier is delayed through a delay element 206, which can be a transmission line, for example. The inverted error signal is recombined with the delayed version of the output of the power amplifier 152 through a summer 208 to remove OOB emissions and reduce distortion levels. The output of the summer 208 is then provided to an optional final band pass filter 210 that filters out any remaining unwanted signals outside the desired transmission band.

The digital cross-cancellation technique in accordance with an aspect of the present invention can supply appropriately delayed correction for amplifier distortions and can correct spectral leakage (a form of OOB emissions) that occurs from intentional clipping of the wanted signals performed to allow for amplifier size reduction (e.g., amplifiers in the input and supply paths are sized to according to the peak signals). Additionally, since an unclipped digital reference signal is employed to determine the desired correction at the output, any modification of the signal can be corrected at the final output stage without the need for additional correction information during the amplification process. The DCC technique is highly desirable since it does not rely on any a priori information about the source or details of amplifier distortion. The variable supply levels employed in the present invention complicate digital predistortion techniques which generally require such a priori information.

Figure 5:
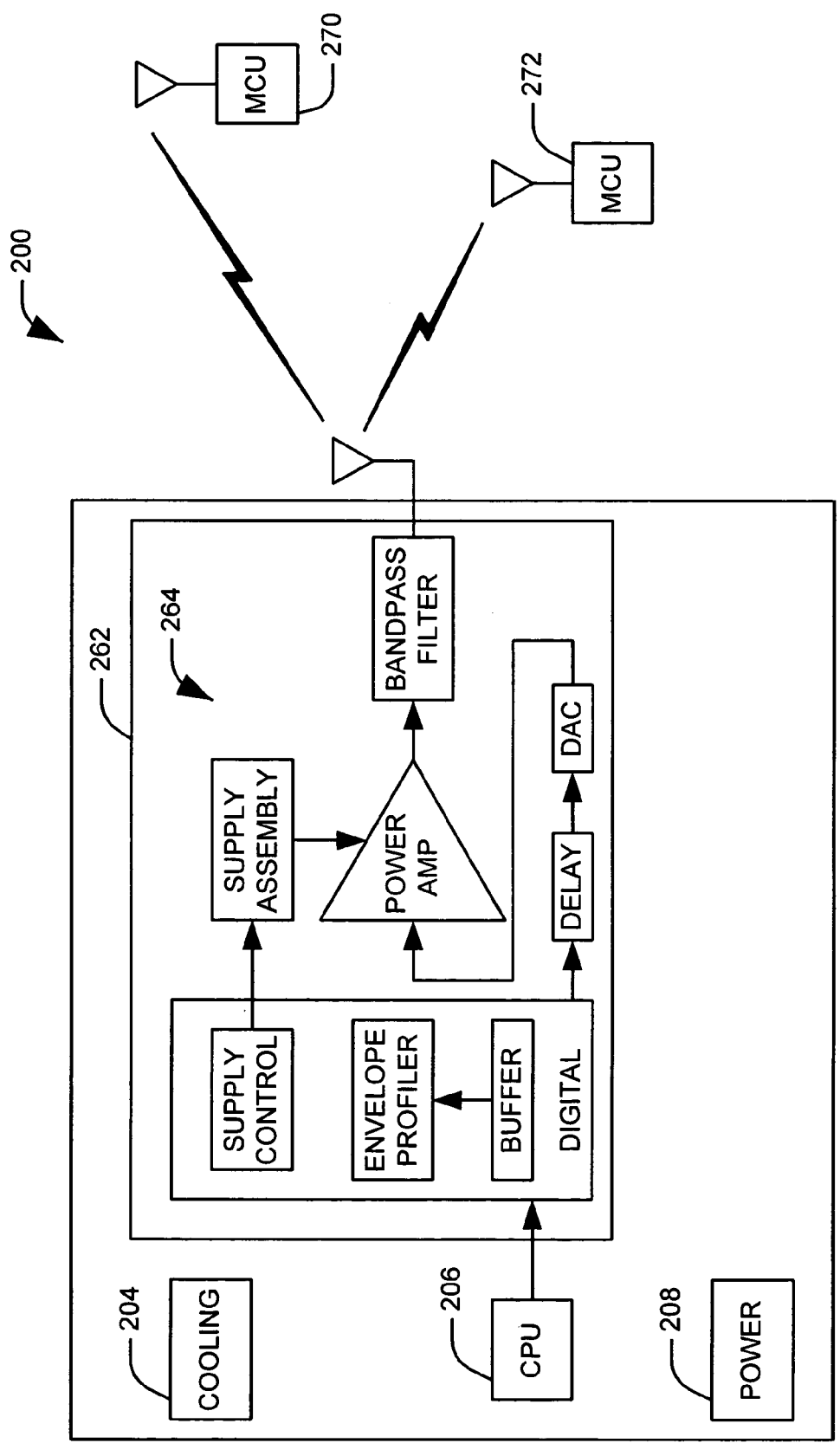
FIG. 5 illustrates a communication system having a base station incorporating a variable supply amplifier system in accordance with an aspect of the present invention.

The amplifier system of the present invention can be employed in a variety of applications. The amplifier system can be employed in wireless transmitter applications for base stations (e.g., satellites, cellular), handsets, and other mobile communication devices. FIG. 5 illustrates a communication system 250 having a base station 252 with a transmitter 262 employing a variable supply amplifier system 264 having an envelope profiler producing a supply voltage at a decreased slew rate in accordance with an aspect of the present invention. The amplifier system 264 varies the supply to an associated power amplifier according a "lookahead" analysis performed on a buffered interval of the signal.

A central processing unit (CPU) 256 is coupled to a digital portion of the amplifier 264. The CPU 256 can facilitate control and threshold selection of the amplifier system 264. For example, the CPU 256 can generate the type of signal (e.g., WCDMA, GSM, OFDM) to be transmitted and select the parameters for developing a supply voltage profile. The base station 252 communicates to a group of mobile communication unit (MCUs) comprised of MCUs 270 and 272. The MCUs 270 and 272 are for illustrative purposes and it should be appreciated that the group of MCUs can include a greater number of MCUs based on the number of carriers in the output signal.

The base station 252 also includes cooling devices 254 and power devices 258. The power devices 258 can include AC-DC conversion components and battery backup devices that protect the base station 252 from power loss failures. Although the base station 252 is illustrated as having a single transmitter 262, the base station 252 can have a plurality of transmitters communicating to different respective groups of MCUs over similar communication signal standards or different communication signal standards. Additionally, the MCUs 270 and 272 can also include transmitters with variable supply amplifier systems that operate in a manner similar to that described for the transmitter 262.

Figure 6:
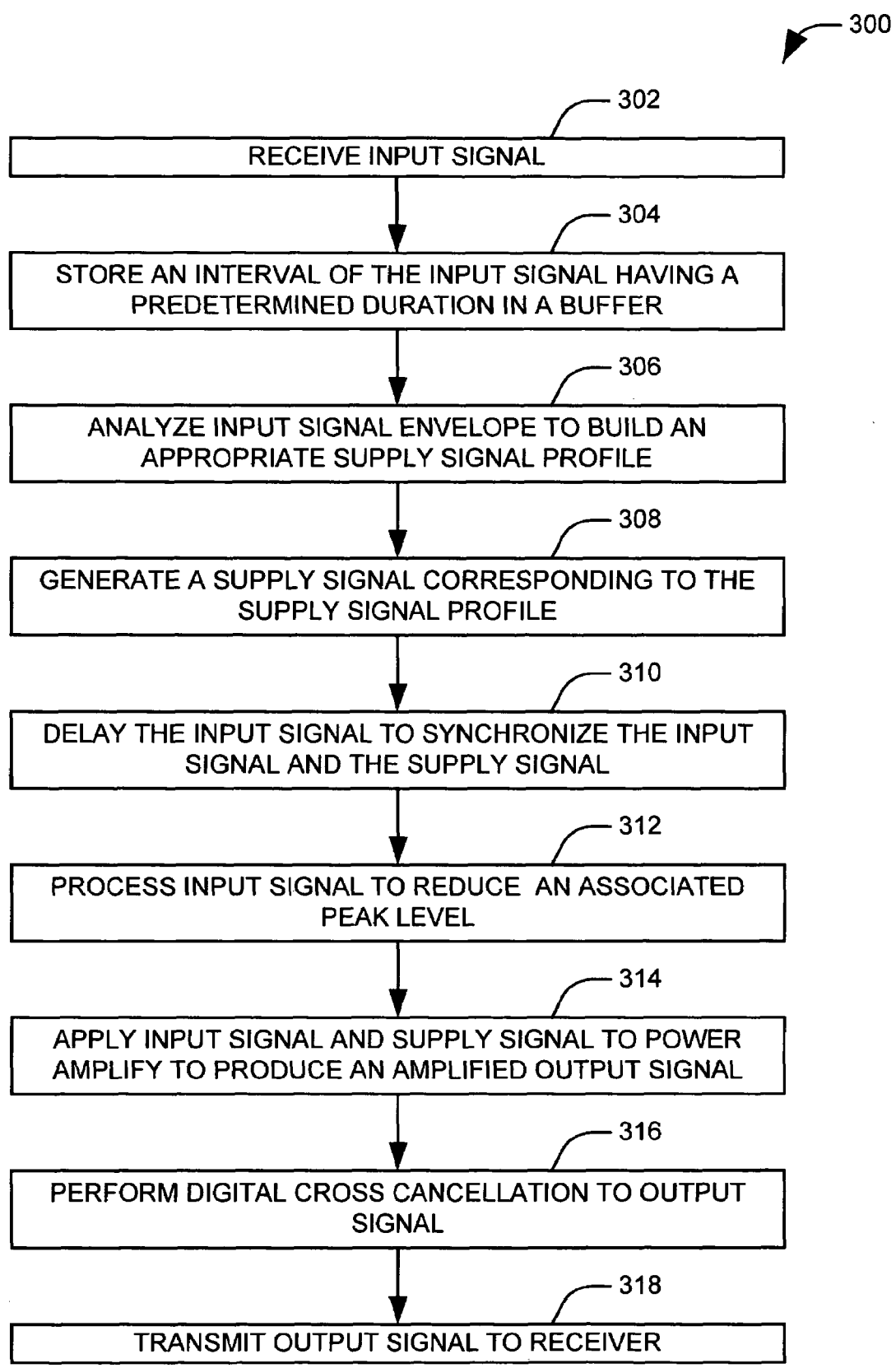
FIG. 6 illustrates a methodology for operating an amplifier system having a power amplifier with a supply terminal and an input terminal in accordance with an aspect of the present invention.

In view of the foregoing structural and functional features described above, a methodology in accordance with various aspects of the present invention will be better appreciated with reference to FIG. 6. While, for purposes of simplicity of explanation, the methodology of FIG. 6 is shown and described as executing serially, it is to be understood and appreciated that the present invention is not limited by the illustrated order, as some aspects could, in accordance with the present invention, occur in different orders and/or concurrently with other aspects from that shown and described herein. Moreover, not all illustrated features may be required to implement a methodology in accordance with an aspect the present invention.

FIG. 6 illustrates a methodology 300 for operating an amplifier system having a power amplifier with a supply terminal and an input terminal in accordance with an aspect of the present invention. The methodology begins at 302 when an input signal is received at the amplifier system. The input signal can be phase and amplitude modulated as to carry information. At 304, an interval of the input signal is stored in a buffer. The interval can be a reasonable time interval ranging from a few milliseconds to a few seconds or more. It will be appreciated that time intervals of less than a few milliseconds could be reasonable as the attendant technologies advance.

At 306, the signal envelope of the buffered signal interval is analyzed to build an appropriate supply signal profile. The constructed profile tracks the supply voltage to peaks and troughs in the signal amplitude supply voltage profile according to at least a maximum slew rate parameter. By limiting the slew rate of the supply signal, it is possible to use more efficient components. Accordingly, the buffered signal is reviewed for regions of rapid change in the signal amplitude (e.g., peaks) and the supply signal is gradually raised or lowered beginning some time prior to the change accordingly at the allowed slew rate to match the input signal. Other parameters can be taken into account, such as a minimum headroom parameter or a minimum supply parameter.

At 308, a supply signal is generated according to the supply signal profile. At 310, the input signal is delayed as to synchronize the input signal with the supply signal. The duration of the delay is selected to ensure that the appropriate supply voltage will be provided at each point in the input signal. At 312, the power amplifier supply signal and the power amplifier input signal are processed to reduce peak signal levels associated with the input signal. This can be accomplished via clipping of the received input signal or an addition of signals.

At 314, the delayed input signal and a supply signal generated from the determined supply signal profile are provided to the power amplifier to amplify the input signal. The input signal and the supply signal can be provided in digital format, and converted into the analog domain via respective DACs (e.g., delta-sigma modulated DACs). The amplifier supply signal is then amplified, for example, employing a Class-S or Class-G amplifier/modulator, prior to being provided to the supply terminal of the power amplifier.

At 316, digital cross-cancellation is performed on the output of the power amplifier. The digital cross-cancellation technique provides a digital reference of the wanted signal to a separate DAC generating a "clean" version of the wanted signal. The clean version of the wanted signal is inverted and combined with the actual output signal from the power amplifier to determine the unwanted portion of the output signal. The unwanted portion of the input signal is then inverted and combined with a delayed version of the output of the power amplifier to cancel the unwanted portion from the output signal. At 318, the predistorted, digitally cross-cancelled recombined signal is transmitted to one or more destination receivers.

What has been described above includes exemplary implementations of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications, and variations that fall within the spirit and scope of the appended claims.

What is claimed is:

1. A variable supply amplifier system comprising:
   a power amplifier operative to amplify an input signal;
   a digital buffer that stores a copy of the input signal representing a predetermined interval of time;
   an envelope profiler that analyzes the buffered interval of the input signal and determines an appropriate supply signal profile for the power amplifier over the predetermined time interval;
   a supply control that provides a digital supply signal according to the determined profile; and
   a supply assembly that processes the digital supply signal to provide a supply voltage corresponding to the supply signal profile to the power amplifier.

2. The system of claim 1, the envelope profiler determining the appropriate supply profile as to optimize one of an efficiency parameter and a linearity parameter associated with at least one of the power amplifier and the supply assembly.

3. The system of claim 1, the envelope profiler determining the appropriate supply profile having a slew rate corresponding to a maximum bandwidth associated with the supply assembly.

4. The system of claim 3, the envelope profiler determining an appropriate supply profile according to the maximum bandwidth and a headroom parameter, which defines a minimum voltage by which the supply signal must exceed a desired output signal associated with the power amplifier.

5. The system of claim 1, the supply assembly comprising a digital-to-analog converter (DAC) and an amplifier.

6. The system of claim 5, the DAC comprising a delta-sigma DAC, such that the digital representations of at least one of the input signal and the supply signal are converted into an analog domain directly at a desired radio transmission frequency.

7. The system of claim 1, further comprising a predistortion component that modifies at least one of the input signal and the supply signal in a digital domain to mitigate output distortion of the power amplifier.

8. The system of claim 1, further comprising a digital cross-cancellation component that generates a reference signal corresponding to a desired output signal of the amplifier system, the reference signal being combined with a portion of an output signal from the power amplifier to determine an error signal, the error signal being inverted and combined with a delayed version of the output signal of the power amplifier to generate a final output signal.

9. The system of claim 1, further comprising a predistortion component that modifies at least one of the supply signal and the input signal to mitigate output distortion of the power amplifier and a digital cross-cancellation component that generates a reference signal corresponding to a desired output signal of the amplifier system, the reference signal being combined with a portion of an output signal from the power amplifier to determine an error signal, the error signal being inverted and combined with a delayed version of the output signal of the power amplifier to generate a final output signal.

10. The system of claim 9, the reference signal being provided to a delta-sigma digital-to-analog converter (DAC) to convert the reference signal from a digital domain to an analog domain directly to a desired radio transmission frequency.

11. The system of claim 9, further comprising a peak-to-average reduction (PAR) component that clips and/or removes peaks signals from the input signal, the digital cross-cancellation component providing corrective signals to the final output signal.

12. The system of claim 1, further comprising a feedback path to compensate for variations in age and temperature of the amplifier system.

13. A transmitter comprising the amplifier system of claim 1.

14. A base station comprising the transmitter of claim 13.

15. The system of claim 1, further comprising a delay component that delays the input signal as to synchronize the input signal with the supply signal.

16. A method of amplifying an input signal comprising:
   buffering at least a portion an input signal corresponding to an interval of time;
   analyzing the buffered signal portion to determine an appropriate supply signal for a power amplifier across the interval of time;

delaying the input signal to synchronize the input signal with the determined supply signal at the power amplifier; and amplifying the input signal at the power amplifier using the determined supply signal to produce an amplified output signal.

17. The method of claim 16, further comprising modifying at least one of the input signal and the supply signal in a digital domain to mitigate distortion of the amplified output signal introduced by the power amplifier.

18. The method of claim 16, further comprising:
generating a reference signal corresponding to a desired output signal of the power amplifier;
combining the reference signal with a portion of the amplified output signal to determine an error signal;
inverting the error signal; and
combining the error signal with a delayed version of the amplified output signal of the power amplifier to generate a final output signal.

19. The method of claim 16, further comprising:
modifying at least one of the input signal and the supply signal in a digital domain to mitigate distortion of the amplified output signal introduced by the power amplifier;
generating a reference signal corresponding to a desired output signal of the power amplifier;
combining the reference signal with a portion of the amplified output signal to determine an error signal;
inverting the error signal; and
combining the error signal with a delayed version of the amplified output signal of the power amplifier to generate a final output signal.

20. A variable supply amplifier system comprising:
means for building a supply profile based on analyzing a signal envelope corresponding to an input signal over a period of time and based on one of maintaining a predetermined maximum slew rate, optimizing an efficiency parameter, and optimizing a linearity parameter;
means for producing an amplifier supply signal over the period of time corresponding to the supply profile; and
means for amplifying the input signal, the means for amplifying receiving the amplifier supply signal as a supply voltage based on the supply profile.

21. The system of claim 20, further comprising means for synchronizing the input signal with the supply signal.

22. The system of claim 20, further comprising means for converting at least a portion of the input signal from a digital domain to an analog domain directly to a desired radio transmission frequency.

23. The system of claim 20, further comprising means for modifying the input signal and means for modifying an output signal to facilitate the power amplifier efficiency and mitigate out-of-band emissions.

24. The system of claim 23, further comprising means for providing feedback to the means for modifying.

* * * * *